US011762585B2

(12) United States Patent
Boehm et al.

(10) Patent No.: US 11,762,585 B2
(45) Date of Patent: Sep. 19, 2023

(54) OPERATING A MEMORY ARRAY BASED ON AN INDICATED TEMPERATURE

(71) Applicant: Micron Technology, Inc., Boise, ID (US)

(72) Inventors: Aaron P. Boehm, Boise, ID (US); Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/180,503

(22) Filed: Feb. 19, 2021

(65) Prior Publication Data

US 2021/0294530 A1 Sep. 23, 2021

Related U.S. Application Data

(60) Provisional application No. 62/993,483, filed on Mar. 23, 2020.

(51) Int. Cl.
*G06F 3/06* (2006.01)
*G11C 11/408* (2006.01)
(Continued)

(52) U.S. Cl.
CPC .......... *G06F 3/0659* (2013.01); *G06F 3/0604* (2013.01); *G06F 3/0653* (2013.01);
(Continued)

(58) Field of Classification Search
CPC .... G06F 3/0659; G06F 3/0604; G06F 3/0653; G06F 3/0673; G06F 3/0614; G06F 3/0679; G06F 3/06
See application file for complete search history.

(56) References Cited

U.S. PATENT DOCUMENTS 9,761,294 B1 * 9/2017 Healy ................. G11C 11/1653
10,021,777 B2 * 7/2018 Stoev .................... G11B 19/046
(Continued)

FOREIGN PATENT DOCUMENTS

WO 2017034726 A1 3/2017

OTHER PUBLICATIONS

:Method for memory-module thermal protection, IP.com (Year: 2002).*

(Continued)

*Primary Examiner* — Khoa D Doan
(74) *Attorney, Agent, or Firm* — Holland & Hart LLP

(57) ABSTRACT

Methods, systems, and devices related to operating a memory array are described. A system may include a memory device and a host device. A memory device may indicate information about a temperature of the memory device, which may include sending an indication to the host device after receiving a signal that initializes the operation of the memory device or storing an indication, for example in a register, about the temperature of the memory device. The information may include an indication that a temperature of the memory device or a rate of change of the temperature of the memory device has satisfied a threshold. Operation of the memory device, or the host device, or both may be modified based on the information about the temperature of the memory device. Operational modifications may include delaying a sending or processing of memory commands until the threshold is satisfied.

29 Claims, 8 Drawing Sheets

(51) Int. Cl.
*G11C 11/4091* (2006.01)
*G11C 11/22* (2006.01)

(52) U.S. Cl.
CPC .......... *G06F 3/0673* (2013.01); *G11C 11/221* (2013.01); *G11C 11/4087* (2013.01); *G11C 11/4091* (2013.01)

(56) References Cited

U.S. PATENT DOCUMENTS

| | | | |
|---|---|---|---|
| 10,373,656 B2 | 8/2019 | Takada et al. | |
| 2008/0228959 A1* | 9/2008 | Wang | G06F 1/206 710/22 |
| 2009/0316231 A1* | 12/2009 | Shibahara | H04N 1/02815 358/475 |
| 2011/0227608 A1* | 9/2011 | Floyd | H03K 5/2472 327/63 |
| 2014/0098404 A1* | 4/2014 | Kambegawa | H04N 1/00954 358/1.16 |
| 2014/0258786 A1 | 9/2014 | Resnick | |
| 2015/0301744 A1* | 10/2015 | Kim | G06F 3/0616 711/103 |
| 2017/0071056 A1* | 3/2017 | Stoev | G11C 7/04 |
| 2018/0046231 A1 | 2/2018 | Raghu et al. | |
| 2018/0293029 A1 | 10/2018 | Achtenberg et al. | |
| 2019/0018713 A1* | 1/2019 | Foxworth | G06F 9/5094 |
| 2019/0025784 A1* | 1/2019 | Yum | G05B 19/042 |
| 2019/0050147 A1* | 2/2019 | Koo | G06F 3/0653 |
| 2020/0097217 A1* | 3/2020 | Yeh | G11C 16/10 |
| 2020/0133510 A1* | 4/2020 | Koudele | G06F 3/0614 |

OTHER PUBLICATIONS

C. Zambelli, E. Ferro, L. Crippa, R. Micheloni and P. Olivo, "Dynamic VTH Tracking for Cross-Temperature Suppression in 3D-TLC NAND Flash," 2019 IEEE International Integrated Reliability Workshop (IIRW), 2019, pp. 1-4, doi: 10.1109/IIRW47491. 2019.8989886. (Year: 2019).*

IP.com, "Method and Apparatus for DRAM Refresh Management Accounting for Temperature and Traffic Conditions", Apr. 3, 2013 (Year: 2013).*

Y. Tsiatouhas, "Periodic Bias-Temperature Instability monitoring in SRAM cells," 2017 22nd IEEE European Test Symposium (ETS), Limassol, Cyprus, 2017, pp. 1-2, doi: 10.1109/ETS.2017.7968221. (Year: 2017).*

ISA/KR, International Search Report and Written Opinion of the International Searching Authority, Int'l Appl. No. PCT/US2021/019259, dated Jun. 11, 2021, Korean Intellectual Property Office, Seo-gu, Daejeon, Republic of Korea, 11pgs.

* cited by examiner

OPERATING A MEMORY ARRAY BASED ON AN INDICATED TEMPERATURE

CROSS REFERENCE

The present Application for Patent claims the benefit of U.S. Provisional Patent Application No. 62/993,483 by BOEHM et al., entitled "OPERATING A MEMORY ARRAY BASED ON AN INDICATED TEMPERATURE," filed Mar. 23, 2020, assigned to the assignee hereof, and expressly incorporated by reference herein.

BACKGROUND

The following relates generally to one or more memory systems and more specifically to operating a memory array based on an indicated temperature.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain stored logic states for extended periods of time even in the absence of an external power source. Volatile memory devices, e.g., DRAM, may lose stored states when disconnected from an external power source.

DETAILED DESCRIPTION

Figure 1:
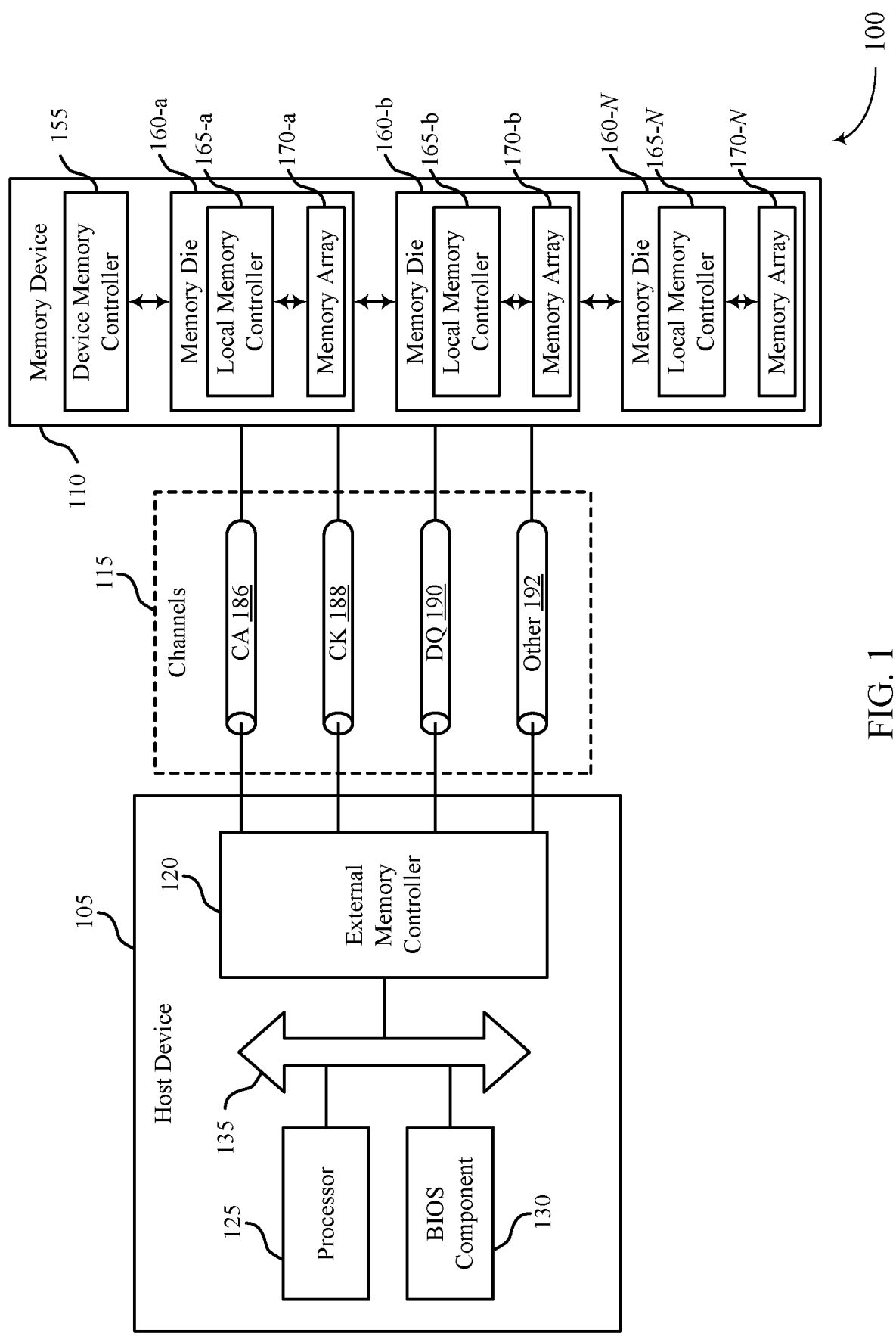
FIG. 1 illustrates an example of a system that supports operating a memory array based on an indicated temperature in accordance with examples as disclosed herein.

A memory device and a host device (e.g., a device that uses the memory device to store information) may be included in a system related to memory. In some cases, a system (or one or more subsystem components) may be deployed in an extreme environment that experiences a large range of temperatures—e.g., temperatures ranging from −40° C. to 125° C. In some cases, a memory device operating in an extreme environment may be unable to meet one or more one or more thresholds for operating the memory device ("operating thresholds"), such as an error rate threshold or power consumption threshold, across the entire temperature range—e.g., the memory device may fail to meet the operating thresholds when temperatures are near a lower or upper bound of the temperature range. In some examples, to determine whether a memory device will meet the one or more operating thresholds while deployed in an extreme environment, a manufacturer may test each memory device across the entire temperature range and discard one or more the memory devices that do not satisfy the one or more operating thresholds across the entire temperature range. Discarding such memory device may increase a cost of memory devices manufactured for extreme environments.

To avoid waste and reduce costs while also ensuring that an increased quantity of memory devices will satisfy one or more operating thresholds when operating in extreme environments, a memory device (or a memory system) may modify its operation based on a temperature of the memory device. To support temperature-based modifications to an operation of a memory system, one or more temperatures of a memory device may be indicated to a host device, and an operation of one or both of the memory device and the host device may be modified based on the one or more temperatures of the memory device. In some examples, a memory device may be configured to delay a processing of commands for accessing a memory array (or "access commands") at the memory device or may use modified parameters for accessing the memory array (or "access parameters") until a temperature of a memory device has reached a threshold (also referred to herein as a temperature threshold). A host device may be configured to delay a sending of access commands to the memory device until the temperature of the memory device has reached the temperature threshold. Thus, by modifying an operation of the memory system based on a temperature of the memory device, a memory system (or one or more of the memory system's subcomponents) may ensure that a memory device will satisfy the one or more operating thresholds—even if the memory device fails to satisfy the one or more operating thresholds across the entire temperature range.

Features of the disclosure are initially described in the context of a memory system and memory die as described with reference to FIGS. 1 and 2. Features of the disclosure are described in the context of a diagram and process flow as described with reference to FIGS. 3 and 4. These and other features of the disclosure are further illustrated by and described with reference to apparatus diagrams and flowcharts that relate operating a memory array based on an indicated temperature as described with references to FIGS. 5 through 8.

FIG. 1 illustrates an example of a system 100 that supports operating a memory array based on an indicated temperature in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing unit (GPU), a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host device or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors. In some cases, the memory device 110 may use a dynamic random access memory (DRAM) technology, a ferroelectric random access technology (FeRAM), a phase change memory (PCM) technology, or some other memory technology to store data.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a GPU, a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface (e.g., buses, one or more pins) for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dice 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dice may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dice 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

A system 100 may be deployed in an environment that experiences a large temperature range—e.g., temperatures ranging from −40° C. to 125° C. Operating in an environment associated with large temperature ranges may impact the performance, capability, or both, of a memory device 110. For example, operating in an environment having temperatures at a lower or upper bound of a large temperature range may increase (1) a quantity of errors associated with writing data to, storing data at, and reading data from a memory device 110; (2) durations associated with accessing data stored in the memory device 110; (3) a power consumption of the memory device 110, or any combination thereof.

In some cases, the effect on a capability of a memory device 110 caused by temperature may cause any combination of an error rate, timing, or power consumption of a memory device 110 to exceed one or more operating thresholds. In some cases, the one or more operating thresholds may be associated with specifications advertised by a manufacturer for a memory device 110 that indicate details regarding an operation of the memory device. For example, a manufacturer may provide that, while deployed in the field, a memory device 110 will process data with an error rate that is below an error rate threshold; access (e.g., read from or write to) memory cells within a duration threshold; and use an amount of power that is below a power threshold. In some examples, the one or more operating thresholds may be associated with parameters set by a user. For example, a user may constrain (or expect) a memory device 110 to meet one or more operating thresholds requested by the user while deployed in the field. In some cases, the one or more operating thresholds advertised by a manufacturer may match or exceed the one or more operating thresholds requested by a user.

In some cases, system 100 may be deployed in a field or industry (e.g., industrial or automotive applications) that is associated with large temperature ranges. For example, system 100 may operate in environment having low temperatures (e.g., <−30° C.) and/or high temperatures (e.g., >115° C.). In some cases, if memory device 110 is subjected to relatively low operating temperatures (e.g., <−30° C.) at startup, memory device 110 may operate with reduced functionality and may be unable to meet operating thresholds (e.g., timing, power, and/or reliability thresholds) that are advertised for memory device 110—e.g., in a set of manufacturer specifications drafted for memory device 110. For example, a capability of memory device 110 to capture data and/or retain data may be reduced, which may result in an error rate of memory device 110 exceeding advertised reliability thresholds. A timing for accessing (e.g., reading from or writing to) memory cells in memory device 110 may be increased, which may result in a duration for accessing memory device 110 exceeding an advertised timing thresholds. And a power consumption of memory device 110 may be increased—e.g., when the memory device is a high performance complementary metal oxide semiconductor (CMOS) device—which may result in a power consumption of memory device 110 exceeding advertised power thresholds. Similarly, if the memory device is subjected to relatively high operating temperatures (e.g., >115° C.) at startup, memory device 110 may operate with reduced functionality and may be unable to meet timing, power, and/or reliability conditions that are advertised for memory device 110.

To ensure that a memory device 110 will meet the one or more operating thresholds, a manufacturer may test each memory device 110 across a temperature range (e.g., −40° C. to 125° C.) that the memory device 110 may be subjected to while deployed in the field. During the testing, the manufacturer may determine whether an operation of each memory device 110 is capable of satisfying the one or more operating thresholds across the entire temperature range. In some examples, the manufacturer may discard memory devices 110 that do not satisfy the one or more operating thresholds across the entire temperature. However, deploying memory devices that meet the advertised conditions across large temperature ranges (e.g., −40° C. to 125° C.) may result in a large quantity of memory devices being discarded, increasing a cost associated with manufacturing such memory devices. Alternatively, deploying memory devices that fail to meet the advertised conditions at the extremes of the large temperature ranges may result in memory devices that operate outside of advertised specifications, which may result in operational failures for devices using the memory devices. Such failures may result in critical failures (e.g., safety failures) when memory devices are implemented in particular fields.

To avoid waste and reduce costs while also ensuring that an increased quantity of memory devices 110 satisfy indicated operating thresholds when operating in extreme environments, a temperature of a memory device 110 may be indicated to a host device 105 and used to modify an operation of the system 100. By indicating a temperature of the memory device 110 to the host device 105, a memory system may ensure that a memory device 110 will satisfy the one or more operating thresholds—even if the memory device 110 fails to satisfy the one or more operating thresholds across the entire temperature range.

In some examples, the memory device 110 may be configured to ignore or delay a processing of memory commands until a temperature of the memory device 110 exceeds a temperature threshold. Similarly, a host device 105 may be configured to delay a transmission of memory commands until an indication that the temperature of the memory device 110 has exceeded the temperature threshold has been received. In some examples, different parameters associated with inputs (e.g., input voltages, timings, etc.) used to operate a memory device 110 ("input parameters") may be used when a temperature of the memory device 110 is below a temperature threshold than when the temperature of the memory device 110 is above the temperature threshold—e.g., the memory device 110 may adjust voltage parameters, timing parameters, or both. Similarly, the host device 105 may be configured to use different input parameters when the temperature of the memory device 110 is below or above the temperature threshold. In some cases, the temperature threshold may be selected to correspond to a temperature at which the memory device 110 meets one or more operating thresholds established for the memory device 110.

In some examples, to reduce a period associated with reaching the temperature threshold, the memory device 110 may be configured to execute refresh operations while a temperature of the memory device 110 is below a temperature threshold. Similarly, a host device 105 may be configured to send one or more refresh commands to the memory device 110 while the temperature of the memory device 110 is below the temperature threshold.

To support indicating a temperature of a memory device 110 to a host device 105, a memory device 110 may include a temperature sensor that is configured to measure a temperature of the memory device 110 (or a memory array included in the memory device 110) and a tunable logic component that is configured to compare an output of the temperature sensor with a temperature threshold. In some cases, the output of the tunable logic component is provided to a pin that is directly accessible by a host device 105. In some cases, the memory device 110 may also include a mode register that is configured to store an output of the tunable logic component and can be read by the host device 105.

Figure 2:
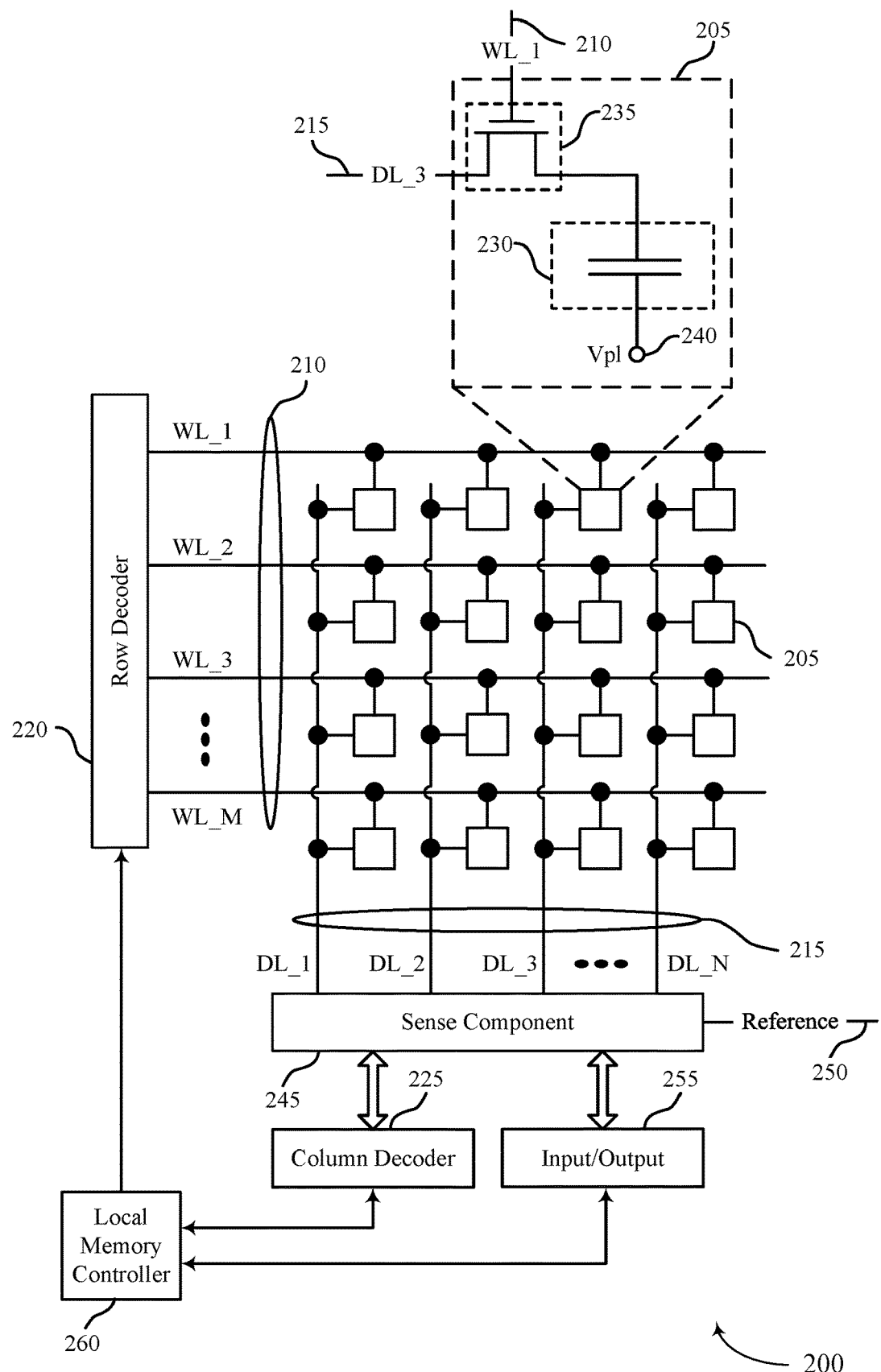
FIG. 2 illustrates an example of a memory die that supports operating a memory array based on an indicated temperature in accordance with examples as disclosed herein.

FIG. 2 illustrates an example of a memory die 200 that supports operating a memory array based on an indicated temperature in accordance with examples as disclosed herein. The memory die 200 may be an example of the memory dice 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations, such as reading and writing operations, may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation.

In some cases, a memory die 200 may be deployed in an extreme environment that experiences large temperature ranges—e.g., temperatures ranging from −40° C. to 125° C. In some cases, a memory die 200 operating in an extreme environment may be unable to meet one or more one or more operating thresholds for the memory die 200, such as an error rate threshold or power consumption threshold, across the entire temperature range. In some examples, to determine whether a memory die 200 will meet the one or more operating thresholds while deployed in an extreme environment, a manufacturer may test a memory die 200 across the entire temperature range and discard the memory die 200 if the memory die 200 does not satisfy the one or more operating thresholds across the entire temperature range. Discarding such memory dice may increase a cost of memory dice used in such fields.

To avoid waste and reduce costs while also ensuring that an increased quantity of memory die 200 will satisfy one or more operating thresholds when operating in extreme environments, a memory system may modify its operation based on a temperature of the memory die 200. To support the modified operation of the memory system, a temperature of the memory die 200 may be indicated to a host device, and an operation of one or both of the memory die 200 and the host device may be modified based on the temperature of the memory die 200. In some examples, a memory die 200 may be configured to delay a processing of commands for accessing a memory array (or "access commands") at the memory die 200 or may use modified parameters for accessing the memory array (or "access parameters") until a temperature of a memory die 200 has reached a temperature threshold. Similarly, a host device may be configured to delay sending access commands to memory die 200 until the temperature of the memory die 200 has reached the temperature threshold. Thus, by modifying an operation of the memory system based on a temperature of the memory die 200, a memory system may ensure that a memory die 200 will satisfy the one or more operating thresholds—even if the memory die 200 fails to satisfy the one or more operating thresholds across the entire temperature range.

Figure 3:
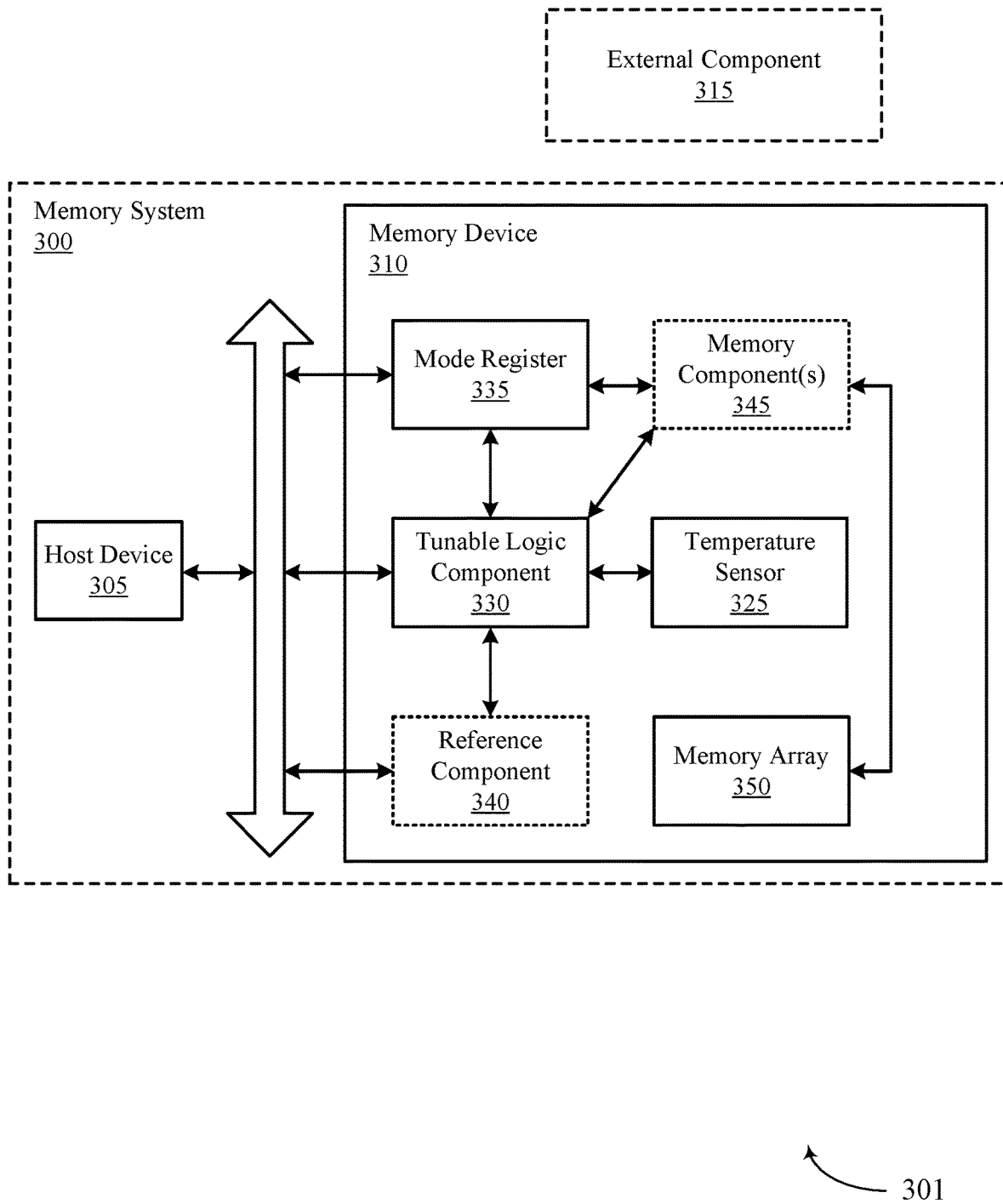
FIG. 3 illustrates an example of an operating environment that supports operating a memory array based on an indicated temperature in accordance with examples as disclosed herein.

FIG. 3 illustrates an example of an operating environment 301 that supports operating a memory array based on an indicated temperature in accordance with examples as disclosed herein. It is to be understood that operating environment 301 is merely one illustrative example, and that many implementations, including other specific systems, circuits, and topologies, are possible while adhering to the principles and techniques disclosed herein, as will be appreciated by one of ordinary skill in the art.

Operating environment 301 may include system 300 and external component 315. In some cases, operating environment 301 may represent an electronics system that is included in a vehicle (e.g., a terrestrial, aerial, or nautical vehicle). In some cases, operating environment 301 may be deployed in an extreme environment that experiences large range of temperatures.

System 300 may be an example of a system 100, as described with reference to FIG. 1. In some cases, aspects of system 300 are installed in a particular electronic system of a vehicle (e.g., within an autonomous driving component or vehicle display unit). System 300 may include host device 305 and memory device 310.

Host device 305 may be an example of a host device 105, as described with reference to FIG. 1. Host device 305 may be configured to initiate storage of data at a memory device—e.g., for a user application being executed at host device 305 or another device that is coupled with host device 305. Host device 305 may also be configured to access data stored at memory device—e.g., for the user application. In some cases, host device 305 may send, to memory device 310, commands for accessing data stored at memory device 310 (or "access commands")—e.g., in memory array 350. In some examples, host device 305 may store data in memory array 350 by sending a write command to memory device 310 and access data stored in memory array 350 by sending a read command to memory device 310.

Memory device 310 may be an example of memory device 110 and memory die 200, as described with reference to FIGS. 1 and 2. Memory device 310 may be configured to store data for devices and provide data to devices upon request—e.g., after receiving a request for data from a device, such as host device 305. In some cases, memory device 310 may include temperature sensor 325, tunable logic component 330, mode register 335, reference component 340, one or more memory components 345, and memory array 350.

Temperature sensor 325 may be configured to measure a temperature of memory device 310 (or memory array 350). Temperature sensor 325 may be further configured to provide a signal, such as a real-time signal, to tunable logic component 330 that may indicate one or more temperatures of the memory device 310 (or memory array 350) to tunable logic component 330. In some examples, temperature sensor 325 may be collocated with memory array 350 (e.g., within, adjacent to, or on top of memory array 350). In some cases, temperature sensor 325 may be a CMOS temperature sensor and may operate over a large range of temperatures (e.g., −50° C. to 135° C.). In some cases, temperature sensor 325 may output a signal having a voltage that is representative of a temperature of memory device 310 (or memory array 350)—for example, a voltage range of temperature sensor 325 (e.g., 0 to 1.5V) may be mapped (e.g., using a one-to-one mapping) to the measurable temperature range of temperature sensor 325 (e.g., −50° C. to 135° C.).

Tunable logic component 330 may be configured to compare a temperature indicated by temperature sensor 325 with a threshold temperature. In some cases, tunable logic component 330 may be further configured to indicate to host device 305 when a temperature of memory device 310 is below or above one or more temperature thresholds. In some cases, tunable logic component may compare the temperature of memory device 310 (or memory array 350) by comparing a voltage of a signal received from temperature sensor 325 with a voltage that is representative of the threshold voltage. In some cases, tunable logic component 330 receives the voltage that is representative of the threshold voltage from reference component 340.

Tunable logic component 330 may output a signal that is representative of a temperature of memory device 310 (or memory array 350). In some examples, tunable logic component 330 outputs a real-time signal that indicates when a temperature of the memory device is below or above one or more temperature thresholds. In some examples, tunable logic component 330 transmits an indication that a temperature of memory device 310 has exceeded one or more threshold—e.g., tunable logic component 330 may transmit an indication to mode register 335 when a temperature of memory device 310 exceeds a first threshold.

Tunable logic component 330 may be a single or multi-level trip-point comparator and may receive one or more voltage from reference component 340 that represent one or more temperature thresholds. In some cases, tunable logic component 330 signals different voltage outputs to indicate which of multiple temperature thresholds a temperature of memory device 310 has exceeded—e.g., a first voltage level may indicate that the temperature is below all of the temperature thresholds, a second voltage level may indicate that the temperature is above a first threshold, a third voltage level may indicate that the temperature is above a second threshold, and so on. Similarly, tunable logic component 330 may be configured to send different data combinations to mode register 335—e.g., binary state "00" may indicate that the temperature is below all of the temperature thresholds, binary state "01" may indicate that the temperature is above a first threshold, and so on.

Tunable logic component 330 may also be configured to identify a rate of change for a temperature of memory device 310 (or memory array 350) based on one or more signals received from temperature sensor 325. For example, tunable logic component 330 may be configured to receive two or more indications of temperatures of memory device 310 and determine one or more rates of change of the memory device by determining one or more differences in temperature changes relative to one or more durations.

Mode register 335 may be configured to store information related to a temperature of memory device 310. In some cases, mode register 335 may be configured to store an indication that a temperature of memory device 310 is above one or more thresholds after receiving an indication from tunable logic component 330 that the temperature of the memory device has exceeded a temperature threshold. In some examples, mode register 335 may be a latch. In some cases, mode register 335 may be polled (e.g., periodically) by host device 305. In some examples, mode register 335 may be temperature hardened and may be configured to operate over a larger temperature range than memory device 310 (e.g., from −50° C. to 135° C.).

The reference component 340 may be configured to indicate one or more temperature thresholds to tunable logic component 330. In some cases, the reference component 340 may be configured to output one or more voltages that are representative of the one or more temperature thresholds. In some examples, a voltage used to output a particular temperature by the reference component 340 is equivalent to a voltage used to output the particular temperature by temperature sensor 325—e.g., to allow a direct comparison of voltages output by the reference component 340 and temperature sensor 325. In some examples, the one or more temperature thresholds may be programmed at the reference component 340 according to a predetermined value (e.g., set by a manufacturer specification or standard). The predetermined value may be acquired through validation (e.g., silicone validation) or testing. In such examples, the one or more temperature thresholds may be based on individual or group testing (e.g., related to design ID or process lot). In some cases, the one or more temperatures may be stored in a fuse bank located at memory device 310. In some examples, the one or more temperature thresholds may be fixed or variable.

In some examples, reference component 340 may receive the one or more temperature thresholds (or adjustments to the one or more temperature thresholds) from host device 305 (e.g., during a startup procedure) or any other component related to system 300. In some examples, the reference component 340 may be included within tunable logic component 330.

Memory components 345 may be configured to perform function that support the operation of memory device 310. In some cases, memory components 345 may include a power supply, logic circuitry, and/or a memory controller. In some examples, memory components 345 are thermally coupled with other components in memory device 310, such as memory array 350.

Memory array 350 may be configured to store data. In some cases, memory array 350 may include memory cells—e.g., DRAM cells, FeRAM cells, PCM cells, etc. In some examples, the memory cells included in memory array 350 may be accessed in accordance with a read or write operation executed by a memory controller of memory device 310.

External component 315 may be a heater, a battery, a GPU, a system on chip (SoC), or any other external component that may be close in proximity to system 300. In some cases, the external component may be thermally coupled to system 300.

As discussed herein, discarding memory devices that are unable to meet indicated operating thresholds across an entire temperature range may increase a cost of memory devices that are deployed in extreme environments. Alternatively, deploying memory devices that are unable to meet indicated operating thresholds across an entire temperature range may result in critical failures during operations.

To avoid waste and reduce costs while ensuring reliability of memory devices that are deployed in environments having large temperature ranges, among other advantages, a memory device may be configured to delay memory operations until a temperature of the memory device has reached a temperature where the memory device may operate within advertised operating thresholds. In some examples, a memory device may be configured to operate in a limited mode of operation until a temperature of the memory device has reached the temperature where the memory device may operate within advertised operating thresholds.

In some examples, after receiving a signal (e.g., a power signal) that initializes system 300, temperature sensor 325 may provide a real-time temperature reading to tunable logic component 330. Tunable logic component 330 may compare the temperature reading with a temperature threshold (e.g., provided by the reference component 340). In some examples, while the temperature readout from temperature sensor 325 is below a threshold, memory device 310 may ignore (or buffer) any access commands received from host device 305 until the temperature of memory device 310 (or memory array 350) reaches a temperature threshold.

In some cases, based on receiving the power signal, memory array 350 may perform one or more refresh operations until the temperature of memory device 310 reaches a temperature threshold. Performing refresh operation may include executing a sequence of operations for sensing logic states from memory array 350 and writing back logic states to memory array 350. In some cases, the refresh operations are referred to as "dummy" refresh operations and are performed while memory array 350 stores indeterminate data—that is, the data stored in memory array 350 may be unknown at a time when memory device 310 is initialized. In some examples, memory array 350 performs the refresh operation(s) based on receiving one or more commands to perform the refresh operation ("refresh commands") received. In other examples, memory array 350 performs the refresh operations on its own in response to receiving the power signal. By performing refresh operations at initialization and while a temperature of memory device 310 is below a threshold, the internal temperature of memory device 310 may be increased while memory array 350 stores indeterminate data, and thus, without introducing errors into data stored at memory array 350.

In some cases, once the temperature readout from temperature sensor 325 reaches a temperature threshold, tunable logic component 330 may indicate that the temperature of memory device 310 has reached the temperature threshold. In some cases, tunable logic component 330 may indicate the temperature by changing a voltage of a signal being provided to host device 305—e.g., the tunable logic component may transition the signal from a low to high voltage, or vice versa. Additionally, or alternatively, tunable logic component 330 may transmit an indication to mode register 335 that the temperature of memory device 310 has exceeded a threshold. In some cases, tunable logic component 330 may send a multi-level signal to host device 305 and/or a multi-bit signal to mode register 335. Mode register 335 may store the indication that the temperature of memory device 310 has exceeded the threshold.

After tunable logic component 330 indicates the temperature of memory device 310 has exceeded a temperature threshold, host device 305 may determine that the temperature of memory device 310 has exceeded a temperature threshold. In some examples, host device 305 may determine that the temperature of memory device 310 has exceeded a temperature threshold based on detecting a change in a signal provided from tunable logic component 330. In other examples, host device 305 may determine that the temperature of memory device 310 has exceeded a temperature threshold by polling mode register 335—that is by reading data stored in mode register 335 one or more times.

In some examples, memory components 345 may be initialized based on the power signal received by system 300. In some cases, a temperature of memory device 310 may be increased based at least in part on the operation of memory components 345. Also, in some examples, external component 315 may be initialized at a same time as system 300 and a temperature of memory device 310 may be increased based at least in part on the operation of external component 315—e.g., due to thermal coupling between external component 315 and system 300.

Figure 4:
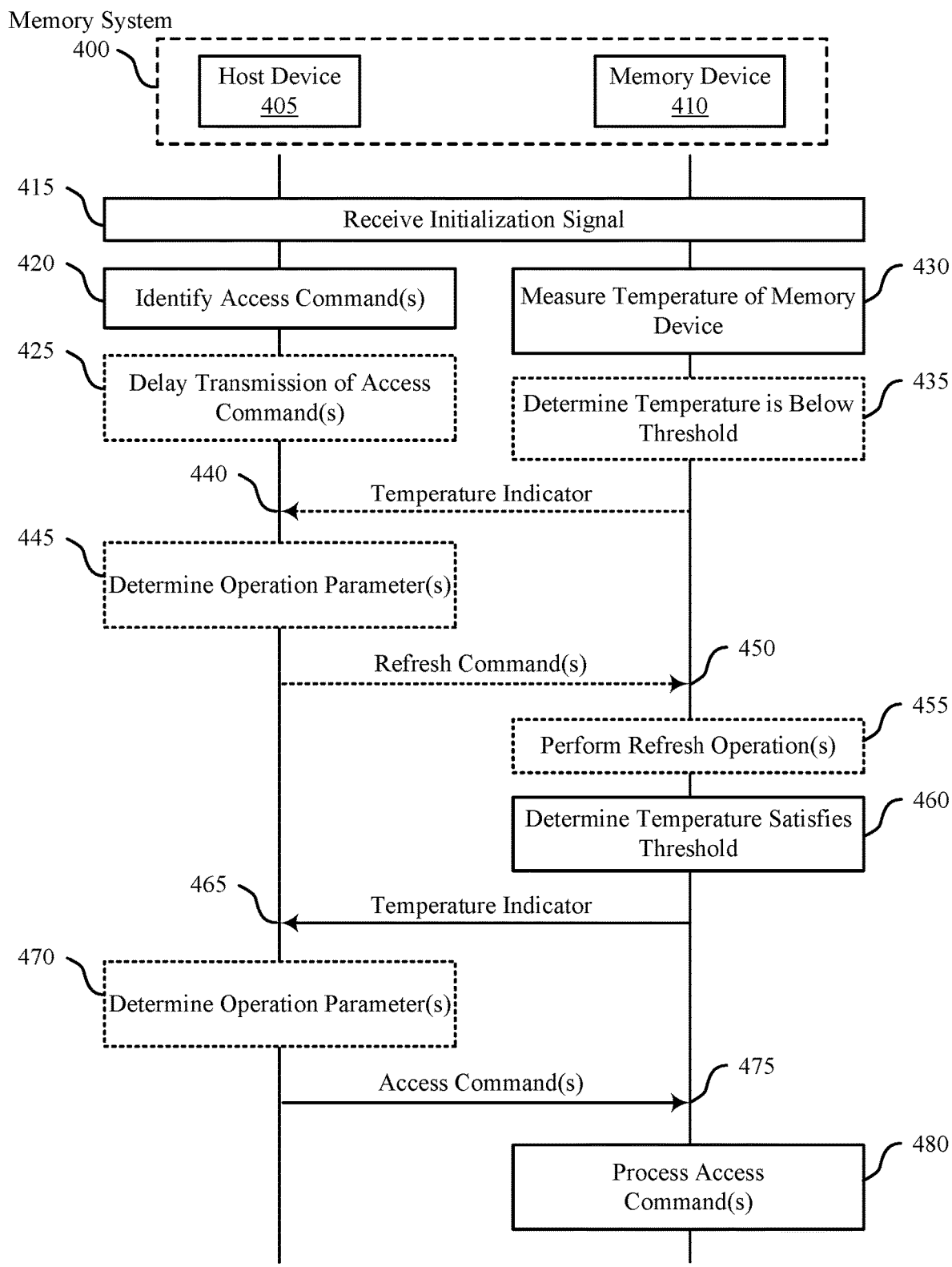
FIG. 4 illustrates an example of a process flow that supports operating a memory array based on an indicated temperature in accordance with examples as disclosed herein.

FIG. 4 illustrates an example of a process flow 401 that supports operating a memory array based on an indicated temperature in accordance with examples as disclosed herein. Process flow 401 may illustrate a procedure for indicating a temperature of memory device 410 to host device 405 within a system 400. System 400 may be an example of a system 100 and system 300, as described with reference to FIGS. 1 and 3. Host device 405 may be an example of host device 105 and host device 305, as described with reference to FIGS. 1 and 3. Memory device 410 may be an example of memory device 110, memory die 200, and memory device 310, as described with reference to FIGS. 1 through 3.

In some cases, before performing the operations described at block 415, a testing procedure may be performed to determine whether memory device 410 is capable of meeting one or more operating thresholds across an entire temperature range (e.g., −40° C. to 125° C.). In some examples, the testing procedure may determine that memory device 410 is able to meet the one or more operating thresholds across a reduced portion of the temperature range (e.g., −30° C. to 115° C. or −30° C. to 125° C.)—e.g., when a first set of input parameters are applied to memory device 410. In some examples, the testing procedure may identify one or more temperature thresholds that corresponds to the portion of the temperature range—e.g., a temperature threshold may be equivalent to −30° C. and/or another temperature threshold may be equivalent to 115° C.

In some examples, the testing procedure may determine that memory device 410 is able to meet the one or more operating thresholds across a larger portion of temperature range (e.g., −37° C. to 122° C. or the entire temperature range) when a second set of input parameters is used. In some cases, the second set of input parameters may be associated with larger input voltages, extended timing durations, and/or increased power consumption relative to the first set of input parameters. In some examples, the testing procedure may identify one or more additional temperature thresholds that corresponds to the larger portion of the temperature range—e.g., a temperature threshold may be equivalent to −37° C. and/or another temperature threshold may be equivalent to 122° C.

In some cases, one or more temperature thresholds determined during a testing procedure may be programmed into memory device 410—e.g., the temperature thresholds may be stored in non-volatile latches included in a reference component (e.g., reference component 340 of FIG. 3), a tunable logic component (e.g., tunable logic component 330 of FIG. 3), and/or fuses included in memory device 410.

At block 415, host device 405 and memory device 410 may receive an initialization signal. In some cases, the initialization signal may be a power signal that causes host device 405 and memory device 410 to transition from an off state to an on state. In some cases, while memory device 410 is in an off state, data that was previously stored in one or more memory cells may be lost or degraded (e.g., if the memory cells are volatile). Thus, a logic state of the memory cells may become indeterminate during the off state, and memory device 410 may be unable to accurately determine the data previously stored in the memory cells after returning to the on state. Accordingly, data previously stored in memory device 410 may not be used when memory device 410 transitions to an on state.

At block 420, host device 405 may identify one or more commands for accessing a memory array (e.g., memory array 350 of FIG. 3) included in memory device 410 based on receiving the initialization signal. In some cases, the one or more commands may be referred to as access commands, and the one or more commands may be read or write commands.

At block 425, host device 405 may delay a transmission of the one or more access command to memory device 410 based on a temperature of memory device 410 (or memory array 350). In some cases, host device 405 may refrain from transmitting the one or more access commands until an indication is received from memory device 410 that indicates a temperature of memory device 410 has satisfied a temperature threshold. In some examples, host device 405 receives the indication in a signal received from tunable logic component 330—e.g., based on monitoring a pin that is coupled with host device 405. In some examples, host device 405 receives the indication based on sending a request to read a mode register (e.g., mode register 335 of FIG. 3) included in memory device 410.

In other examples, host device 405 may transmit the one or more access commands to memory device 410 while the temperature of memory device 410 has not satisfied the temperature threshold. In some cases, memory device 410 may ignore or buffer the one or more transmitted access commands until a temperature of memory device 410 (or memory array 350) reaches a temperature threshold.

At block 430, a temperature sensor (e.g., temperature sensor 325 of FIG. 3) at memory device 410 may measure a temperature of memory device 410 (or memory array 350) based on receiving the initialization signal. In some cases, temperature sensor 325 may output a voltage corresponding to the measured temperature. In other cases, temperature sensor 325 may output a data packet comprising a binary value corresponding to a measured temperature.

At block 435, tunable logic component 330 at memory device 410 may determine that a temperature of memory device 410 (or memory array 350) does not satisfy a temperature threshold—e.g., based on comparing the internal temperature of memory device 410 measured by temperature sensor 325 with a threshold value. In some cases, tunable logic component 330 determines that the temperature of memory device 410 is below a low temperature threshold. In other cases, the tunable logic component 330 determines that the temperature of memory device 410 is above a high temperature threshold. The temperature threshold value may be determined according to a manufacturer standard or specification, or in any additional manner as described herein. In some cases, memory device 410 may refrain from accessing memory array 350 while a temperature of memory device 410 is below the temperature threshold. In other cases, memory device 410 may use a first set of access parameters to access memory array 350 based on determining that the temperature of memory device 410 does not satisfy the temperature threshold.

At arrow 440, memory device 410 may provide an indication that the internal temperature of memory device 410 has failed a temperature threshold. In some cases, host device 405 may receive the indication based on monitoring an output of tunable logic component 330. In other cases, host device 405 may receive the indication by sending a request to read mode register 335 at memory device 410. After receiving the request, memory device 410 may transmit the data stored in mode register 335 to host device 405. In some cases, memory device 410 may refrain from processing (e.g., ignore or buffer) commands received from host device 405 when the temperature of memory device 410 is failing the temperature threshold.

At block 445, host device 405 may determine that a first set of parameters is to be used to access memory device 410 based on receiving the indication that the temperature of memory device 410 is failing a temperature threshold. In some examples, host device 405 may determine that an increased voltage and timing parameters associated with extended durations are to be used.

At arrow 450, host device 405 may transmit one or more refresh commands for memory array 350 to memory device 410 based on determining that a temperature of memory device is below a temperature threshold. In some examples, host device 405 may transmit the refresh command before transmitting any access commands for memory array 350 and while memory array 350 stores indeterminate data—e.g., to avoid corrupting data in memory array 350. In some cases, instead of sending refresh commands, host device 405 may transmit dummy access commands—e.g., write commands that carry random data or read commands where the corresponding data outputted by memory device 410 is ignored by host device 405.

At block 455, memory device 410 may perform one or more refresh operations (or dummy access operation). Performing a refresh operation may include performing a sequence of operations to sense and writeback a logic state to one or more memory cells, which may increase the internal temperature readout from temperature sensor 325 of memory device 410. In some cases, memory device 410 performs one or more refresh operation based on receiving the one or more refresh command from host device 405. In some cases, memory device 410 may perform refresh operations until the temperature of the memory device satisfies a temperature threshold based on receiving a single refresh command from host device 405. In some cases, memory device 410 may perform refresh operations after determining that a temperature of memory device 410 is failing a temperature threshold and without receiving refresh commands from host device 405. By performing one or more refresh operations at memory array 350 prior to storing data for host device 405 at memory array 350, a temperature of memory device 410 (or memory array 350) may be increased without creating data errors.

At block 460, tunable logic component 330 at memory device 410 may determine that the temperature of memory device 410 (or memory array 350) satisfies a temperature threshold—e.g., based on comparing the internal temperature of memory device 410 measured by temperature sensor 325 with a threshold value. The temperature threshold may be determined according to a manufacturer standard or specification, or in any additional manner as described herein. In some cases, the temperature of memory device 410 may exceed the temperature threshold based on receiving the initialization signal and/or performing refresh operations. That is, after receiving the initialization signal, one or more memory components at memory device 410 may be activated and generate heat as a result of being activated. Similarly, one or more components (external components such as a battery, heater, etc.) that are thermally coupled with host device 405 and memory device 410 may be activated and generate heat. In some cases, an output of tunable logic component 330 may be disabled after the temperature threshold is satisfied.

In some cases, memory device 410 may use a second set of access parameters to access memory array 350 that is different than the first set of access parameters used at block 435 based on determining that the temperature of memory device 410 is above the temperature threshold. In some cases, the first set of access parameters may be equivalent to an advertised set of access parameters for memory device 410. In some cases, memory device 410 may begin processing commands received from (e.g., currently or previously stored in a buffer) host device 405 after determining that the temperature of memory device 410 has satisfied the threshold.

In some cases, multiple thresholds may be configured at memory device 410. In some examples, a first temperature threshold may be associated with a first temperature, a second temperature threshold may be associated with a second temperature, and so on. In some cases, the first temperature threshold may be based on a first temperature level of memory device 410, where the operation of memory device 410 meets a first set of specifications associated with the memory array when a first set of input (or access) parameters is used for memory device 410. The second temperature threshold may be based on a second temperature level of memory device 410, where the operation of memory device 410 meets the first set (or a different set) of specifications associated with the memory array when a second set of input (or access) parameters is used for memory device 410. In some cases, the second set of input parameters may correspond to input and/or access parameters advertised for memory device 410.

At arrow 465, memory device 410 may provide an indication that the internal temperature of memory device 410 has satisfied a threshold temperature. In some cases, host device 405 may receive the indication based on monitoring an output of tunable logic component 330—e.g., based on detecting a transition of a signal received from a pin of memory device 410 from a low voltage to a high voltage, or vice versa. In other cases, memory device 410 may receive the indication by sending a request to read mode register 335. After receiving the request, memory device 410 may transmit the data stored in mode register 335 to host device 405.

At block 470, host device 405 may determine that a second set of input parameters is to be used to access memory device 410 based on receiving the indication that the temperature of memory device 410 has satisfied the temperature threshold. In some examples, host device 405 may determine that a second set of timing parameters associated with reduced durations relative to the first set of timing parameters described at block 445 is to be used.

At arrow 475, host device 405 may transmit one or more access commands to the memory device based on determining that a temperature of memory device 410 has satisfied a threshold. In some cases, the one or more access commands include the one or more access commands delayed at block 425. At block 480, memory device 410 may process the one or more access commands received from host device 405.

In some cases, tunable logic component 330 at memory device 410 may determine that a temperature of memory device 410 has exceeded an additional temperature threshold. In some cases, memory device 410 may use a different set of access parameters to access memory array 350 based on determining that the additional temperature threshold has been exceeded. In other cases, memory device 410 may use a limited set of access parameters or refrain from accessing memory array 350 based on the additional temperature threshold being exceeded—e.g., if the additional temperature threshold is associated with a high temperature (e.g., >115° C.).

In some cases, tunable logic component 330 at memory device 410 may determine that a rate of change of a temperature of memory device 410 (or memory array 350) has satisfied one or more thresholds. In some cases, memory device 410 may use a different set of access parameters or refrain from accessing memory array 350 based on the rate of change exceeding the threshold, as similarly described with reference to block 430 to arrow 465.

Figure 5:
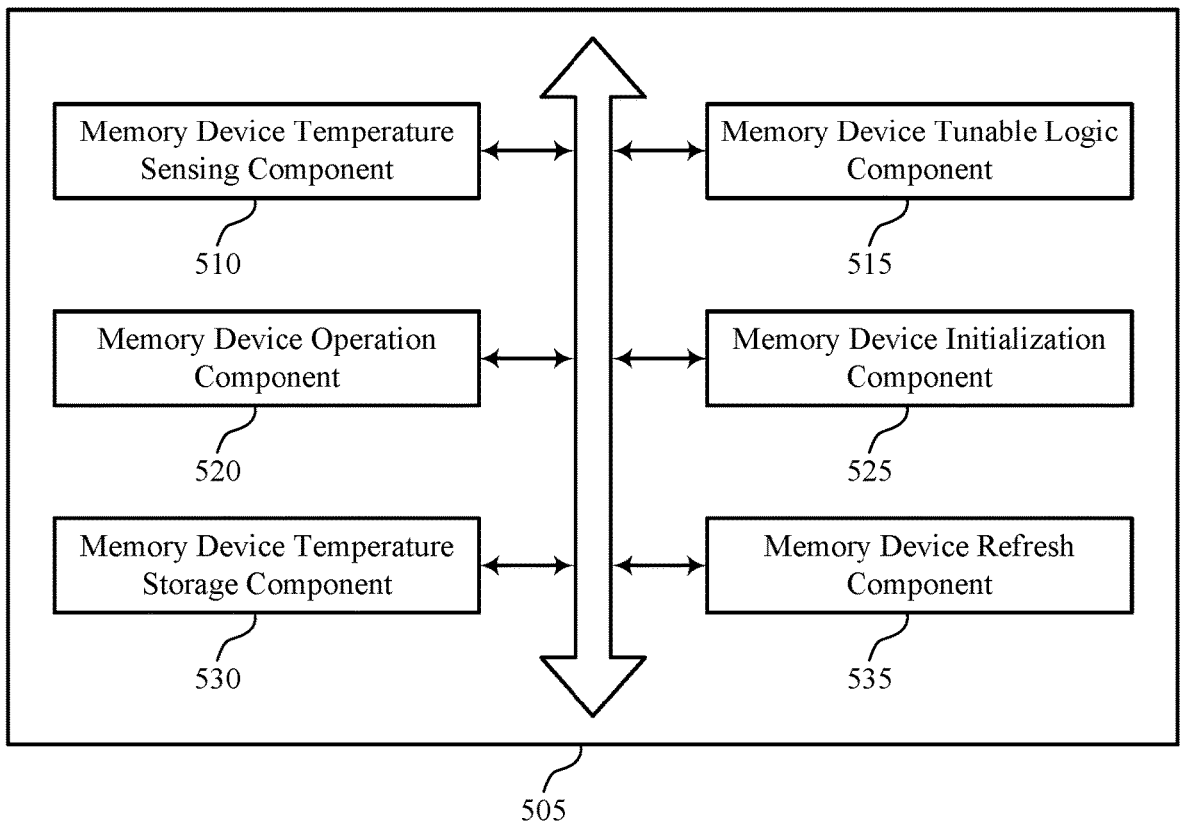
FIG. 5 shows a block diagram of a memory device that supports operating a memory array based on an indicated temperature in accordance with examples as disclosed herein.

FIG. 5 shows a block diagram 500 of a memory device 505 that supports operating a memory array based on an indicated temperature in accordance with examples as disclosed herein. The memory device 505 may be an example of aspects of a memory device as described with reference to FIGS. 1 through 4. The memory device 505 may include a memory device temperature sensing component 510, a memory device tunable logic component 515, a memory device operation component 520, a memory device initialization component 525, a memory device temperature storage component 530, and a memory device refresh component 535. Each of these modules may communicate, directly or indirectly, with one another (e.g., via one or more buses).

The memory device temperature sensing component 510 may determine a temperature of the memory component based on receiving the signal.

In some examples, the memory device temperature sensing component 510 may generate, before generating the indication to the host device, a second indication that the temperature for the memory component is below the threshold based on the determining.

In some examples, the memory device temperature sensing component 510 may generate a second indication that the temperature of the memory component has exceeded a second threshold based on the determining.

In some examples, the memory device temperature sensing component 510 may generate a second indication that a rate of change associated with the temperature of the memory component has exceeded a second threshold based on the determining.

In some examples, the memory device temperature sensing component 510 may send the indication to the host device or a register, or both, based on generating the indication. In some cases, the temperature of the memory component is measured at the memory array.

The memory device tunable logic component 515 may generate an indication that the temperature of the memory component has exceeded a threshold based on the determining.

In some examples, the memory device tunable logic component 515 may compare the temperature of the memory component with the threshold.

In some examples, the memory device tunable logic component 515 may determine that the temperature of the memory component has exceeded the threshold based on the comparing, where the indication is generated based on the determining.

In some examples, the memory device tunable logic component 515 may compare the temperature of the memory component with a second threshold.

In some examples, the memory device tunable logic component 515 may determine that the temperature of the memory component has exceeded the second threshold based on the comparing, where a second indication is generated based on the determining.

In some examples, the memory device tunable logic component 515 may receive a second indication of the threshold from the host device, where the threshold is based on a second temperature level, and where the operation of the memory component meets a set of specifications associated with the memory array when a set of parameters for operating the memory component is used and the temperature of the memory component reaches the second temperature.

In some cases, the threshold is based on a second temperature level, where the operation of the memory component meets a set of specifications associated with the memory array when a set of parameters for operating the memory component is used and the temperature of the memory component reaches the second temperature.

The memory device operation component 520 may process a command for accessing the memory array that is received from a host device based on generating the indication.

In some examples, the memory device operation component 520 may refrain from processing a second command for accessing the memory array based on generating the second indication.

In some examples, the memory device operation component 520 may receive, from the host device, the command for accessing the memory array based on generating the indication, where the command is an initial command received from the host device.

In some examples, the memory device operation component 520 may receive, before the command is received and the indication that the temperature of the memory component has exceeded the threshold is generated, a second command from the host device.

In some examples, the memory device operation component 520 may refrain from processing the second command based at least on the temperature of the memory component being below the threshold.

In some examples, the memory device operation component 520 may receive, from the host device, the command before the indication that the temperature of the memory component has exceeded the threshold is generated.

In some examples, the memory device operation component 520 may delay processing of the command until the indication that the temperature of the memory component has exceeded the threshold is generated.

In some examples, the memory device operation component 520 may use a first set of parameters for operating the memory array based on determining that the temperature of the memory component has exceeded the threshold.

In some examples, the memory device operation component 520 may receive, from the host device, a request to read the stored value.

The memory device initialization component 525 may receive a signal that initializes an operation of a memory component that includes a memory array.

In some cases, the temperature of the memory component increases from a first temperature after the signal that initializes the operation of the memory component is received based on the operation of the memory component, and where the indication is generated based on the temperature of the memory component increasing.

In some cases, one or more components that are thermally coupled with the memory component are operated based on the first signal, and where the temperature of the memory component increases from a first temperature after the signal is received based on the operation of the one or more components, and where the indication is generated based on the temperature of the memory component increasing.

The memory device temperature storage component 530 may store a value corresponding to the indication that the temperature of the memory component has exceeded the threshold based on the generating.

In some examples, the memory device temperature storage component 530 may send the stored value to the host device based on receiving the request.

The memory device refresh component 535 may perform, before the indication that the temperature of the memory component has exceeded the threshold is generated, a sequence of operations for sensing logic states from the memory array and writing back the logic states to the memory array while indeterminate data is stored in the memory array.

In some examples, the memory device refresh component 535 may receive, before the indication that the temperature of the memory component has exceeded the threshold is generated, a second command from the host device to perform the operation for sensing logic states from the memory array and writing back the logic states to the memory array while indeterminate data is stored in the memory array.

Figure 6:
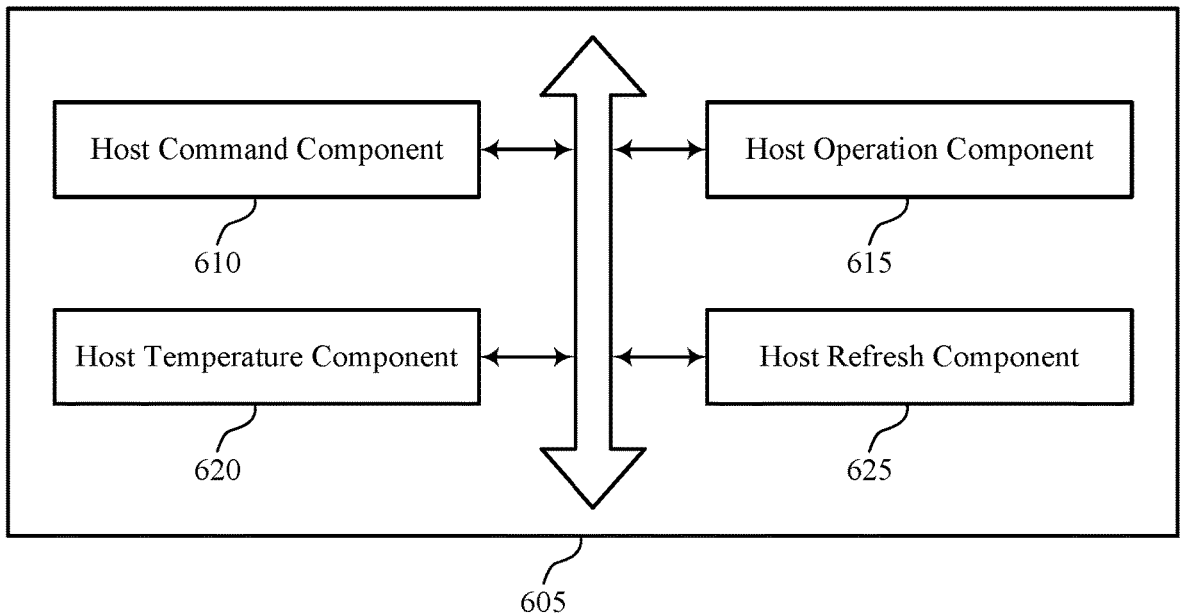
FIG. 6 shows a block diagram of a host device that supports operating a memory array based on an indicated temperature in accordance with examples as disclosed herein.

FIG. 6 shows a block diagram 600 of a host device 605 that supports operating a memory array based on an indicated temperature in accordance with examples as disclosed herein. The host device 605 may be an example of aspects of a host device as described with reference to FIGS. 1-4. The host device 605 may include a host device command component 610, a host device operation component 615, a host device temperature component 620, and a host device refresh component 625. Each of these modules may communicate, directly or indirectly, with one another (e.g., via one or more buses).

The host device command component 610 may identify a command for accessing a memory array of a memory component.

The host device operation component 615 may delay a transmission of the command to the memory component based on a temperature of the memory component.

In some examples, the host device operation component 615 may send, to the memory component, an initial command for accessing a memory array of the memory component based on determining that the temperature of the memory component has exceeded the threshold.

In some examples, the host device operation component 615 may configure a set of parameters for operating the memory array based on determining that the temperature of the memory component has exceeded the second threshold.

In some examples, the host device operation component 615 may transmit the set of parameters to the memory array to the memory component.

In some cases, the transmission of the command to the memory component is delayed based on receiving the second indication that the temperature of the memory component is below the threshold.

The host device temperature component 620 may receive an indication that the temperature of a memory component has exceeded the threshold based on the indication.

In some examples, the host device temperature component 620 may determine that the temperature of the memory component has exceeded the threshold based on receiving the indication, where the initial command is sent based on the determining.

In some examples, the host device temperature component 620 may receive a second indication that the temperature of the memory component has exceeded a second threshold.

In some examples, the host device temperature component 620 may determine that the temperature of the memory component has exceeded the second threshold based on the second indication.

In some examples, the host device temperature component 620 may receive, before the indication that the temperature of the memory component has exceeded the threshold is received, a second indication that the temperature of the memory component is below the threshold.

In some examples, the host device temperature component 620 may send, to the memory component, a second indication of the threshold, where the threshold is based on a second temperature level, where an operation of the memory component meets a set of specifications associated with the memory array when a set of parameters for operating the memory component is used and the temperature of the memory component reaches the second temperature.

In some examples, the host device temperature component 620 may read a register including a value that indicates the temperature of the memory component, where the initial command is sent based on the value indicating that the temperature of the memory component has exceeded the threshold.

The host device refresh component 625 may transmit, before receiving the indication that the temperature of the memory component has exceeded the threshold, a second command directing the memory component to perform a sequence of operations for sensing logic states from the memory array and writing back the logic states to the memory array while indeterminate data is stored in the memory array.

Figure 7:
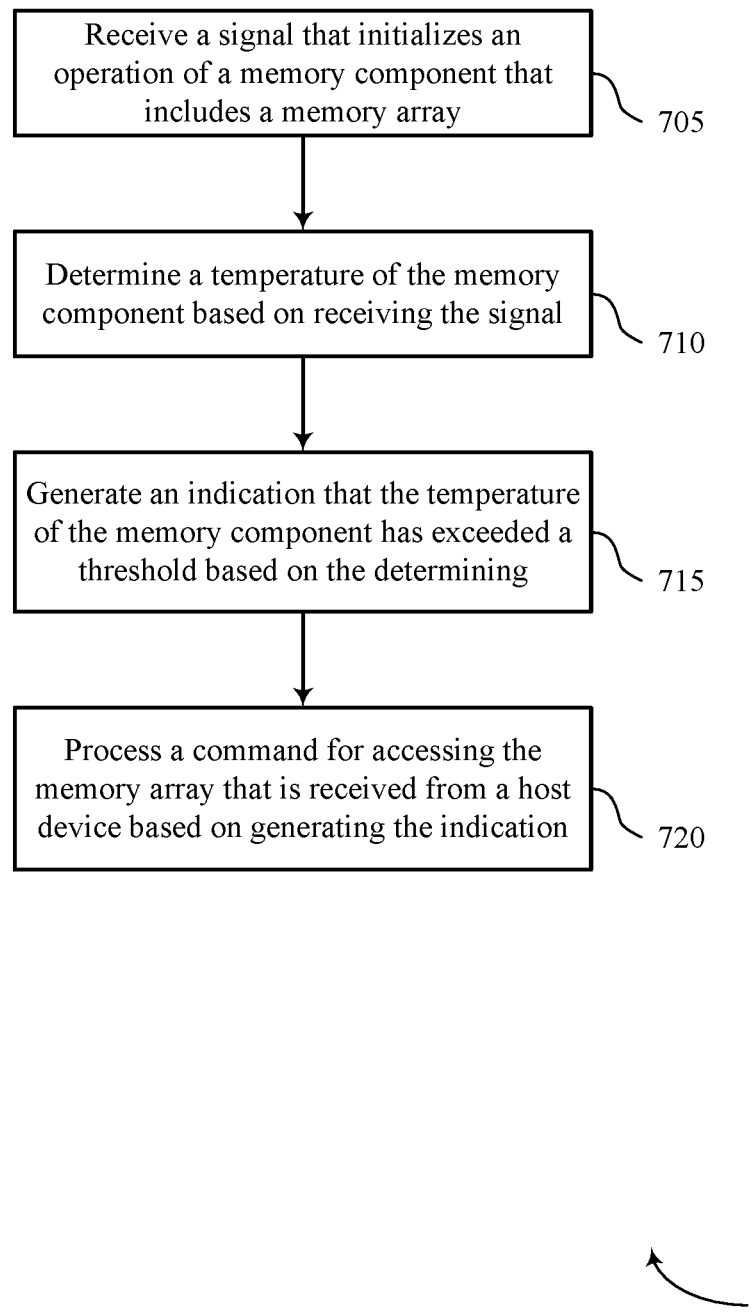
FIGS. 7 and 8 show flowcharts illustrating a method or methods that support operating a memory array based on an indicated temperature in accordance with examples as disclosed herein.

FIG. 7 shows a flowchart illustrating a method or methods 700 that supports operating a memory array based on an indicated temperature in accordance examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally, or alternatively, a memory device may perform aspects of the described functions using special-purpose hardware.

At 705, the memory device may receive a signal that initializes an operation of a memory component that includes a memory array. The operations of 705 may be performed according to the methods described herein. In some examples, aspects of the operations of 705 may be performed by a memory device initialization component as described with reference to FIG. 5.

At 710, the memory device may determine a temperature of the memory component based on receiving the signal. The operations of 710 may be performed according to the methods described herein. In some examples, aspects of the operations of 710 may be performed by a memory device temperature sensing component as described with reference to FIG. 5.

At 715, the memory device may generate an indication that the temperature of the memory component has exceeded a threshold based on the determining. The operations of 715 may be performed according to the methods described herein. In some examples, aspects of the operations of 715 may be performed by a memory device tunable logic component as described with reference to FIG. 5.

At 720, the memory device may process a command for accessing the memory array that is received from a host device based on generating the indication. The operations of 720 may be performed according to the methods described herein. In some examples, aspects of the operations of 720 may be performed by a memory device operation component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for receiving a signal that initializes an operation of a memory component that includes a memory array, determining a temperature of the memory component based on receiving the signal, generating an indication that the temperature of the memory component has exceeded a threshold based on the determining, and processing a command for accessing the memory array that is received from a host device based on generating the indication.

Some examples of the method 700 and the apparatus described herein may further include operations, features, means, or instructions for generating, before generating the indication to the host device, a second indication that the temperature for the memory component may be below the threshold based on the determining.

Some examples of the method 700 and the apparatus described herein may further include operations, features, means, or instructions for generating a second indication that the temperature of the memory component may have exceeded a second threshold based on the determining, and refraining from processing a second command for accessing the memory array based on generating the second indication.

Some examples of the method 700 and the apparatus described herein may further include operations, features, means, or instructions for generating a second indication that a rate of change associated with the temperature of the memory component may have exceeded a second threshold based on the determining.

Some examples of the method 700 and the apparatus described herein may further include operations, features, means, or instructions for sending the indication to the host device or a register, or both, based on generating the indication.

Some examples of the method 700 and the apparatus described herein may further include operations, features, means, or instructions for receiving, from the host device, the command for accessing the memory array based on generating the indication, where the command may be an initial command received from the host device.

Some examples of the method 700 and the apparatus described herein may further include operations, features, means, or instructions for receiving, before the command may be received and the indication that the temperature of the memory component may have exceeded the threshold may be generated, a second command from the host device, and refraining from processing the second command based at least on the temperature of the memory component being below the threshold.

Some examples of the method 700 and the apparatus described herein may further include operations, features, means, or instructions for receiving, from the host device, the command before the indication that the temperature of the memory component may have exceeded the threshold may be generated, and delaying processing of the command until the indication that the temperature of the memory component may have exceeded the threshold may be generated.

Some examples of the method 700 and the apparatus described herein may further include operations, features, means, or instructions for performing, before the indication that the temperature of the memory component may have exceeded the threshold may be generated, a sequence of operations for sensing logic states from the memory array and writing back the logic states to the memory array while indeterminate data may be stored in the memory array.

Some examples of the method 700 and the apparatus described herein may further include operations, features, means, or instructions for receiving, before the indication that the temperature of the memory component may have exceeded the threshold may be generated, a second command from the host device to perform the operation for sensing logic states from the memory array and writing back the logic states to the memory array while indeterminate data may be stored in the memory array.

Some examples of the method 700 and the apparatus described herein may further include operations, features, means, or instructions for comparing the temperature of the memory component with the threshold, determining that the temperature of the memory component may have exceeded the threshold based on the comparing, where the indication may be generated based on the determining, and using a first set of parameters for operating the memory array based on determining that the temperature of the memory component may have exceeded the threshold.

Some examples of the method 700 and the apparatus described herein may further include operations, features, means, or instructions for comparing the temperature of the memory component with a second threshold, and determining that the temperature of the memory component may have exceeded the second threshold based on the comparing, where a second indication may be generated based on the determining.

In some examples of the method 700 and the apparatus described herein, the threshold may be based on a second temperature level, where the operation of the memory component meets a set of specifications associated with the memory array when a set of parameters for operating the memory component may be used and the temperature of the memory component reaches the second temperature.

Some examples of the method 700 and the apparatus described herein may further include operations, features, means, or instructions for receiving a second indication of the threshold from the host device, where the threshold may be based on a second temperature level, and where the operation of the memory component meets a set of specifications associated with the memory array when a set of parameters for operating the memory component may be used and the temperature of the memory component reaches the second temperature.

Some examples of the method 700 and the apparatus described herein may further include operations, features, means, or instructions for storing a value corresponding to the indication that the temperature of the memory component may have exceeded the threshold based on the generating, receiving, from the host device, a request to read the stored value, and sending the stored value to the host device based on receiving the request.

In some examples of the method 700 and the apparatus described herein, the temperature of the memory component increases from a first temperature after the signal that initializes the operation of the memory component may be received based on the operation of the memory component, and where the indication may be generated based on the temperature of the memory component increasing.

In some examples of the method 700 and the apparatus described herein, one or more components that may be thermally coupled with the memory component may be operated based on the first signal, and where the temperature of the memory component increases from a first temperature after the signal may be received based on the operation of the one or more components, and where the indication may be generated based on the temperature of the memory component increasing.

In some examples of the method 700 and the apparatus described herein, the temperature of the memory component may be measured at the memory array.

Figure 8:
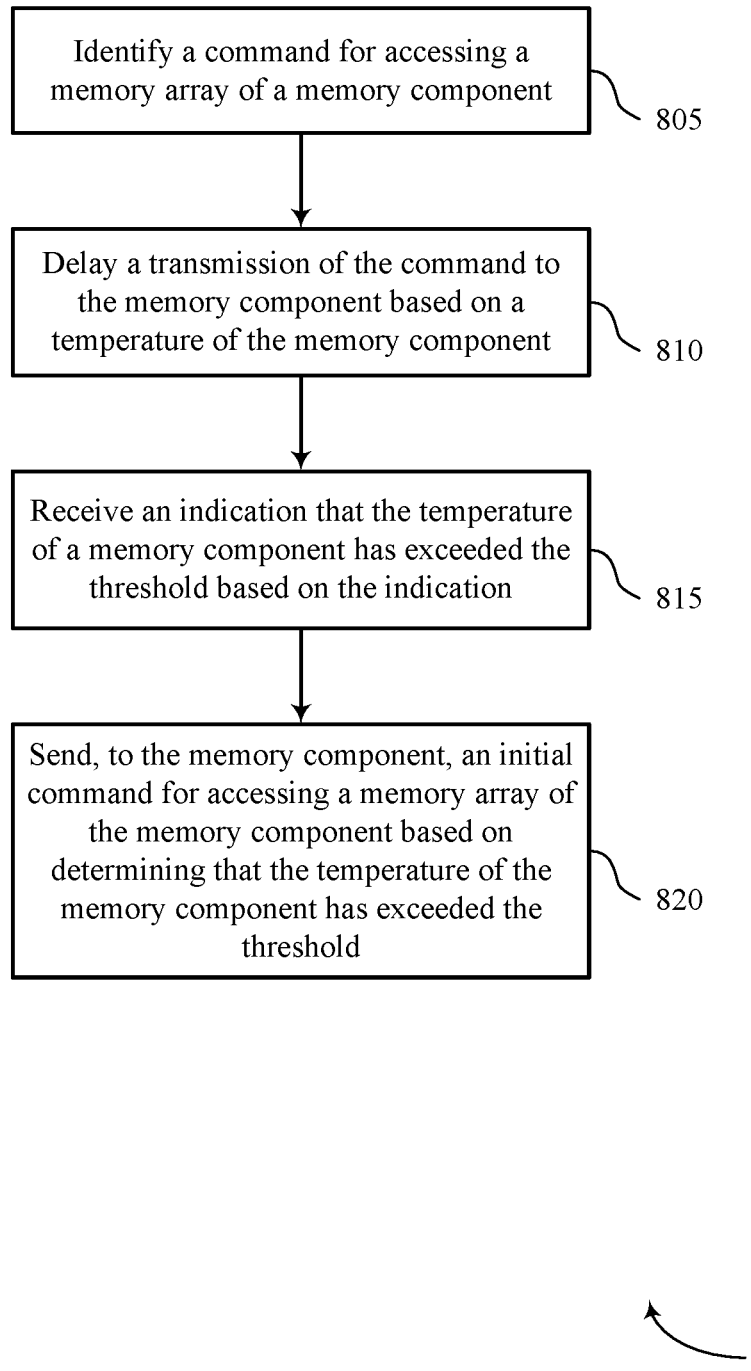

FIG. 8 shows a flowchart illustrating a method or methods 800 that supports operating a memory array based on an indicated temperature in accordance with examples as disclosed herein. The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally, or alternatively, a host device may perform aspects of the described functions using special-purpose hardware.

At 805, the host device may identify a command for accessing a memory array of a memory component. The operations of 805 may be performed according to the methods described herein. In some examples, aspects of the operations of 805 may be performed by a host device command component as described with reference to FIG. 6.

At 810, the host device may delay a transmission of the command to the memory component based on a temperature of the memory component. The operations of 810 may be performed according to the methods described herein. In some examples, aspects of the operations of 810 may be performed by a host device operation component as described with reference to FIG. 6.

At 815, the host device may receive an indication that the temperature of a memory component has exceeded the threshold based on the indication. The operations of 815 may be performed according to the methods described herein. In some examples, aspects of the operations of 815 may be performed by a host device temperature component as described with reference to FIG. 6.

At 820, the host device may send, to the memory component, an initial command for accessing a memory array of the memory component based on determining that the temperature of the memory component has exceeded the threshold. The operations of 820 may be performed according to the methods described herein. In some examples, aspects of the operations of 820 may be performed by a host device operation component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for identifying a command for accessing a memory array of a memory component, delaying a transmission of the command to the memory component based on a temperature of the memory component, receiving an indication that the temperature of a memory component has exceeded the threshold based on the indication, and sending, to the memory component, an initial command for accessing a memory array of the memory component based on determining that the temperature of the memory component has exceeded the threshold.

Some examples of the method 800 and the apparatus described herein may further include operations, features, means, or instructions for determining that the temperature of the memory component may have exceeded the threshold based on receiving the indication, where the initial command may be sent based on the determining.

Some examples of the method 800 and the apparatus described herein may further include operations, features, means, or instructions for receiving a second indication that the temperature of the memory component may have exceeded a second threshold, determining that the temperature of the memory component may have exceeded the second threshold based on the second indication, configuring a set of parameters for operating the memory array based on determining that the temperature of the memory component may have exceeded the second threshold, and transmitting the set of parameters to the memory array to the memory component.

Some examples of the method 800 and the apparatus described herein may further include operations, features, means, or instructions for receiving, before the indication that the temperature of the memory component may have exceeded the threshold may be received, a second indication that the temperature of the memory component may be below the threshold.

In some examples of the method 800 and the apparatus described herein, the transmission of the command to the memory component may be delayed based on receiving the second indication that the temperature of the memory component may be below the threshold.

Some examples of the method 800 and the apparatus described herein may further include operations, features, means, or instructions for transmitting, before receiving the indication that the temperature of the memory component may have exceeded the threshold, a second command directing the memory component to perform a sequence of operations for sensing logic states from the memory array and writing back the logic states to the memory array while indeterminate data may be stored in the memory array.

Some examples of the method 800 and the apparatus described herein may further include operations, features, means, or instructions for sending, to the memory component, a second indication of the threshold, where the threshold may be based on a second temperature level, where an operation of the memory component meets a set of specifications associated with the memory array when a set of parameters for operating the memory component may be used and the temperature of the memory component reaches the second temperature.

Some examples of the method 800 and the apparatus described herein may further include operations, features, means, or instructions for reading a register including a value that indicates the temperature of the memory component, where the initial command may be sent based on the value indicating that the temperature of the memory component may have exceeded the threshold.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array, a sensor configured to sense a temperature of at least a portion of the apparatus, a component coupled with the sensor and configured to compare an output of the sensor with a threshold and indicate a result of the comparison, and a controller coupled with the component and configured to receive and process a command for accessing the memory array based on the output of the sensor being greater than the threshold.

Some examples of the apparatus may include a register coupled with the component and configured to store an indication of the result of the comparison, where the controller may be configured to process the command based on the register storing an indication that the output of the sensor may be greater than the threshold.

Some examples of the apparatus may include a second component configured to provide a reference voltage to the component, where the component may be configured to compare the output of the sensor with the reference voltage.

Some examples of the apparatus may include a host device configured to send commands to the controller based on an indication of the result of the comparison.

Some examples of the apparatus may include a third component that may be thermally coupled with the memory array.

In some examples, the component configured to compare the output of the sensor includes a trip-point comparator.

An apparatus is described. The apparatus may include a memory array, a memory controller that is coupled with the memory array and is operable to, determine a temperature of at least a portion of the apparatus based on a signal that initializes an operation of the apparatus being received, generate an indication that the temperature of the at least the portion of the apparatus has exceeded a threshold based on the measuring, and process a command for accessing the memory array that is received from a host device based on generating the indication.

Some examples may further include generating, before the indication may be generated, a second indication that the temperature for the apparatus may be below the threshold based on the measuring.

Some examples may further include sending the indication to the host device or a register, or both, based on generating the indication.

An apparatus is described. The apparatus may include a memory controller that is operable to, delay a transmission of the command to the memory component based on a temperature of the memory component, receive an indication that the temperature of a memory component has exceeded the threshold based on the indication, and send, to the memory component, an initial command for accessing a memory array of the memory component based on determining that the temperature of the memory component has exceeded the threshold.

Some examples may further include receiving, before the indication that the temperature of the memory component may have exceeded the threshold may be received, a second indication that the temperature of the memory component may be below the threshold.

Some examples may further include receiving a second indication that the temperature of the memory component may have exceeded a second threshold, determine that the temperature of the memory component may have exceeded the second threshold based on the second indication, configure a set of parameters for operating the memory array based on determining that the temperature of the memory component may have exceeded the second threshold, and transmit the set of parameters for operating the memory array to the component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving a signal that initializes an operation of a memory component that comprises a memory array;
    determining a temperature of the memory component based at least in part on receiving the signal;
    using a set of parameters for operation of the memory array based at least in part on determining that the temperature of the memory component has exceeded a threshold, the set of parameters comprising one or more voltage parameters, one or more timing parameters, or both;
    generating an indication that the temperature of the memory component has exceeded the threshold based at least in part on the determining;
    generating a second indication that a rate of change associated with the temperature of the memory component has exceeded a second threshold based at least in part on the determining; and
    processing a command for accessing the memory array that is received from a host device based at least in part on generating the indication, the second indication, or both.

2. The method of claim 1, further comprising:
    generating, before generating the indication to the host device, a second indication that the temperature for the memory component is below the threshold based at least in part on the determining.

3. The method of claim 1, further comprising:
    generating a second indication that the temperature of the memory component has exceeded a second threshold based at least in part on the determining; and
    refraining from processing a second command for accessing the memory array based at least in part on generating the second indication.

4. The method of claim 1, further comprising:
    transmitting the indication to the host device or a register, or both, based at least in part on generating the indication.

5. The method of claim 1, further comprising:
    receiving, before the command is received and the indication that the temperature of the memory component has exceeded the threshold is generated, a second command from the host device; and
    refraining from processing the second command based at least on the temperature of the memory component being below the threshold.

6. The method of claim 1, further comprising:
    receiving, from the host device, the command before the indication that the temperature of the memory component has exceeded the threshold is generated; and
    delaying processing of the command until the indication that the temperature of the memory component has exceeded the threshold is generated.

7. The method of claim 1, further comprising:
    performing, before the indication that the temperature of the memory component has exceeded the threshold is generated, a sequence of operations for sensing logic states from the memory array and writing back the logic states to the memory array while indeterminate data is stored in the memory array.

8. The method of claim 1, further comprising:
    comparing the temperature of the memory component with the threshold; and
    determining that the temperature of the memory component has exceeded the threshold based at least in part on the comparing, wherein the indication is generated based at least in part on the determining.

9. The method of claim 1, further comprising:
    comparing the temperature of the memory component with a second threshold; and
    determining that the temperature of the memory component has exceeded the second threshold based at least in part on the comparing, wherein a second indication is generated based at least in part on the determining.

10. The method of claim 1, wherein the threshold is based at least in part on a second temperature level, wherein the operation of the memory component meets a set of specifications associated with the memory array when the set of parameters for operating the memory component is used and the temperature of the memory component reaches the second temperature level.

11. The method of claim 1, further comprising:
    receiving a second indication of the threshold from the host device, wherein the threshold is based at least in part on a second temperature level, and wherein the operation of the memory component meets a set of specifications associated with the memory array when the set of parameters for operating the memory component is used and the temperature of the memory component reaches the second temperature level.

12. The method of claim 1, further comprising:
    storing a value corresponding to the indication that the temperature of the memory component has exceeded the threshold based at least in part on the generating;
    receiving, from the host device, a request to read the stored value; and
    transmitting the stored value to the host device based at least in part on receiving the request.

13. The method of claim 1, wherein the temperature of the memory component increases from a first temperature after the signal that initializes the operation of the memory component is received based at least in part on the operation of the memory component, and wherein the indication is generated based at least in part on the temperature of the memory component increasing.

14. The method of claim 1, wherein one or more components that are thermally coupled with the memory component are operated based at least in part on the signal, and wherein the temperature of the memory component increases from a first temperature after the signal is received based at least in part on the operation of the one or more components, and wherein the indication is generated based at least in part on the temperature of the memory component increasing.

15. A method, comprising:
receiving a signal that initializes an operation of a memory component that comprises a memory array;
determining a temperature of the memory component based at least in part on receiving the signal;
using a set of parameters for operation of the memory array based at least in part on determining that the temperature of the memory component has exceeded a threshold, the set of parameters comprising one or more voltage parameters, one or more timing parameters, or both;
generating an indication that the temperature of the memory component has exceeded the threshold based at least in part on the determining;
receiving, before the indication that the temperature of the memory component has exceeded the threshold is generated, a command from a host device to perform the operation for sensing logic states from the memory array and writing back the logic states to the memory array while indeterminate data is stored in the memory array; and
processing a command for accessing the memory array that is received from the host device based at least in part on generating the indication.

16. A method, comprising:
identifying a command for accessing a memory array of a memory component;
delaying a transmission of the command to the memory component based at least in part on a temperature of the memory component;
receiving an indication that the temperature of the memory component has exceeded a threshold based at least in part on the indication;
receiving a second indication that a rate of change associated with the temperature of the memory component has exceeded a second threshold based at least in part on the second indication;
configuring a set of parameters for operating the memory array based at least in part on the indication that the temperature of the memory component has exceeded the threshold, the second indication that the rate of has exceeded a second threshold, or both; and
transmitting, to the memory component, an initial command for accessing the memory array of the memory component using the set of parameters based at least in part on determining that the temperature of the memory component has exceeded the threshold.

17. The method of claim 16, further comprising:
determining that the temperature of the memory component has exceeded the threshold based at least in part on receiving the indication, wherein the initial command is sent based at least in part on the determining.

18. The method of claim 16, further comprising:
receiving a second indication that the temperature of the memory component has exceeded a second threshold;
determining that the temperature of the memory component has exceeded the second threshold based at least in part on the second indication;
configuring a second set of parameters for operating the memory array based at least in part on determining that the temperature of the memory component has exceeded the second threshold; and
transmitting the second set of parameters to the memory array to the memory component.

19. The method of claim 16, further comprising:
receiving, before the indication that the temperature of the memory component has exceeded the threshold is received, a second indication that the temperature of the memory component is below the threshold.

20. The method of claim 19, wherein the transmission of the command to the memory component is delayed based at least in part on receiving the second indication that the temperature of the memory component is below the threshold.

21. The method of claim 19, further comprising:
transmitting, before receiving the indication that the temperature of the memory component has exceeded the threshold, a second command directing the memory component to perform a sequence of operations for sensing logic states from the memory array and writing back the logic states to the memory array while indeterminate data is stored in the memory array.

22. The method of claim 16, further comprising:
transmitting, to the memory component, a second indication of the threshold, wherein the threshold is based at least in part on a second temperature level, wherein an operation of the memory component meets a set of specifications associated with the memory array when the set of parameters for operating the memory component is used and the temperature of the memory component reaches the second temperature level.

23. The method of claim 16, further comprising:
reading a register comprising a value that indicates the temperature of the memory component, wherein the initial command is sent based at least in part on the value indicating that the temperature of the memory component has exceeded the threshold.

24. An apparatus, comprising:
a memory array; and
a memory controller that is coupled with the memory array and is operable to:
determine a temperature of at least a portion of the apparatus based at least in part on a signal that initializes an operation of the apparatus being received;
use a set of parameters for operation of the memory array based at least in part on the determining, the set of parameters comprising one or more voltage parameters, one or more timing parameters, or both;
generate an indication that the temperature of the at least the portion of the apparatus has exceeded a threshold based at least in part on the determining;
generate a second indication that a rate of change associated with the temperature of the portion of the apparatus has exceeded a second threshold based at least in part on the determining; and
process a command for accessing the memory array that is received from a host device based at least in part on generating the indication, the second indication, or both.

25. The apparatus of claim 24, wherein the memory controller is further operable to:
generate, before the indication is generated, a second indication that the temperature for the apparatus is below the threshold based at least in part on the determining.

26. The apparatus of claim 24, wherein the memory controller is further operable to:
transmit the indication to the host device or a register, or both, based at least in part on generating the indication.

27. An apparatus, comprising:
a memory controller that is operable to:
identify a command for accessing a memory array of a memory component;
delay a transmission of the command to the memory component based at least in part on a temperature of the memory component;
receive an indication that the temperature of the memory component has exceeded a threshold based at least in part on the indication;
receive a second indication that a rate of change associated with the temperature of the memory component has exceeded a second threshold based at least in part on the second indication;
configure a set of parameters for operating the memory array based at least in part on the indication, the second indication, or both; and
transmit, to the memory component using the set of parameters, an initial command for accessing the memory array of the memory component based at least in part on determining that the temperature of the memory component has exceeded the threshold.

28. The apparatus of claim 27, wherein the memory controller is further operable to:
receive, before the indication that the temperature of the memory component has exceeded the threshold is received, a second indication that the temperature of the memory component is below the threshold.

29. The apparatus of claim 27, wherein the memory controller is further operable to:
receive a second indication that the temperature of the memory component has exceeded a second threshold;
determine that the temperature of the memory component has exceeded the second threshold based at least in part on the second indication;
configure a second set of parameters for operating the memory array based at least in part on determining that the temperature of the memory component has exceeded the second threshold; and
transmit the second set of parameters for operating the memory array to the memory component.

* * * * *